United States Patent
Sasagawa

(12) 
(10) Patent No.: US 6,324,226 B1
(45) Date of Patent: Nov. 27, 2001

(54) VITERBI DECODER

(75) Inventor: Yukihiro Sasagawa, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/714,405

(22) Filed: Nov. 16, 2000

(30) Foreign Application Priority Data

Nov. 22, 1999 (JP) .................................................. 11-331612

(51) Int. Cl.⁷ .......................... H04L 27/06; H03M 13/03
(52) U.S. Cl. ............................................. 375/341; 714/796
(58) Field of Search .................................. 375/341, 262; 714/794, 795, 796

(56) References Cited

U.S. PATENT DOCUMENTS

| | | | |
|---|---|---|---|
| 5,497,384 | * 3/1996 | Fredrickson et al. | 375/341 |
| 5,530,707 | * 6/1996 | Lin | 714/792 |
| 5,537,424 | * 7/1996 | Karabed et al. | 714/795 |
| 5,815,515 | * 9/1998 | Debiri | 714/795 |
| 5,841,796 | 11/1998 | Snyder, Jr. | 375/341 |
| 5,859,861 | 1/1999 | Oh | 375/341 |
| 5,872,817 | 2/1999 | Wei | 375/341 |
| 5,935,270 | * 8/1999 | Lin | 714/795 |

FOREIGN PATENT DOCUMENTS 9-232973 A    9/1997   (JP) .

OTHER PUBLICATIONS

Suzuki H. et al., "Low–Powe Bit–Serial Veterbi Decoder for 3rd Generation W–CDMA Systems," Custom Integrated Circuits, Proceeding of IEEE, 1999, pp. 589–592.*

Wen–Ta Lee et al., "The Radix–2k Viterbi Decoding with Transpose Path Metric Processor," Circuits and System, APCCAS '94', IEEE Asia–Pasfic Conference, pp 194–199.*

* cited by examiner

*Primary Examiner*—Tesfaldet Bocure
(74) *Attorney, Agent, or Firm*—Merchant & Gould PC

(57) ABSTRACT

A Viterbi decoder is provided in which conventional RAMs or the like is used for a path metric memory and a path selection signal memory, and the number of times the memory is accessed in an ACS operation and a trace-back operation is reduced, thus achieving a reduction in power consumption and an increase in speed of processing operations. In this Viterbi decoder, based on branch metrics calculated from input codes by a branch metric operation section, an add-compare-select (ACS) operation section calculates path metrics of respective states by time-sharing processing. The path metrics sequentially calculated by the ACS operation section are delayed temporarily by a path metric permutation section and are permutated to have different time series from those of the path metrics calculated by the ACS operation section, which then are stored in a path metric memory.

6 Claims, 17 Drawing Sheets

FIG. 5B

| Path Selection Read Signal | Shift Register Shift Signal | Value of Up/ Down counter |
|---|---|---|
| 0 | 0 | Retaining Preceding Value |
| 1 | 0 | Adding 1 |
| 0 | 1 | Subtracting 1 |
| 1 | 1 | Retaining Preceding Value |

FIG. 5C

| Value of Up/ Down counter | Word Address |
|---|---|
| 0 | [k-2:s] |
| 1 | [k-3:s-1] |
| 2 | [k-4:s-2] |
| 3 | [k-5:s-3] |

State

State

PRIOR ART

- Long Delay of Address Path
  → Long Delay A
- Long Delay from Address Input to Data Output in Memory
  → Long Delay C

PRIOR ART

VITERBI DECODER

BACKGROUND OF THE INVENTION

1. Field of the Invention

The present invention relates generally to a Viterbi decoder used for maximum likelihood decoding of convolutional codes.

2. Related Background Art

A Viterbi decoder is used for maximum likelihood decoding of convolutional codes, wherein from a plurality of known code sequences of possible input code sequences, a code sequence closest in code distance to that generated by a convolutional encoder is selected as a maximum likelihood code sequence (maximum likelihood path), and based on the information thus selected, decoded data are obtained. The Viterbi decoding has a high capability for correcting random errors occurring in a communication channel and allows a particularly high encoding gain to be obtained in combination with a soft decision decoding system. For instance, in a mobile communication system, in which bit errors affect communication quality considerably and which tends to be affected by interference waves easily, convolutional codes are used as error collecting codes and the Viterbi decoding is employed for decoding them.

This Viterbi decoding algorithm is described briefly. For instance, suppose a convolutional code, with a code rate R=½ and a constraint length K=3, whose generating polynomials are given by the following formulae.

$$G0(D)=1+D^2$$

$$G1(D)=1+D+D^2$$

FIG. 9 shows a structural example of a convolutional encoder for generating such a code. In FIG. 9, information bits as input data are delayed sequentially by two delay elements 901 and 902 such as flip-flops or the like. The input data and data from the delay element 902 are added by an adder 903, which is output as an output G0. The input data and data from the delay element 901 are added by an adder 904 and then data from the adder 904 and the data from the delay element 902 are added by an adder 905, which is output as an output G1.

When the contents of the respective delay elements 901 and 902 in such an encoder are indicated as S[1] and S[0], the states S[1:0] of the encoder can include four states of (00), (01), (10), and (11). There are always two possible transition states with respect to an input.

In other words, in the case of an input "0", when a current state is (00) or (01), it is subjected to the transition to the state (00), and when the current state is (10) or (11), it is subjected to the transition to the state (01). In the case of an input "1", when the current state is (00) or (01), it is subjected to the transition to the state (10), and when the current state is (10) or (11), it is subjected to the transition to the state (11).

As a method of illustrating such state transitions, a trellis diagram is used, and such state transitions are illustrated by a trellis diagram shown in FIG. 10. In FIG. 10, solid-line arrows (branches) indicate transitions in the case of an input "0" and broken-line branches indicate transitions in the case of an input "1". The numerals provided along the respective branches are codes (G0, G1) output upon the transitions of the respective branches.

As is apparent from FIG. 10, two branches become confluent in transition to the respective states without fail. In the Viterbi decoding algorithm, a combination (a path) of maximum likelihood (most likely) branches out of the two respective branches reaching the respective states is selected and information (a path selection signal) of the path (a surviving path) thus selected is stored in a memory. The path selection is executed until a predetermined path length is obtained and then a maximum likelihood surviving path is searched (traced back) based on contents of the path selection signal memory. Based on the change of the respective maximum likelihood states obtained by the trace-back, information input to the convolutional encoder is decoded.

The Viterbi decoder for decoding convolutional codes based on such a Viterbi algorithm basically includes a branch metric calculation means, an ACS (add-compare-select) operation means, a path metric memory, a path selection signal memory, and a trace-back means. The branch metric calculation means calculates code distances (branch metrics) between input code sequences and code sequences predicted in respective branches. The ACS operation means calculates accumulated values (path metrics) of branch metrics reaching respective states and selects surviving paths. The path metric memory stores the path metrics of the respective states, and the path selection signal memory stores information of the selected paths. The trace-back means searches maximum likelihood surviving paths based on the contents of the path selection signal memory.

In the above-mentioned ACS operation means, the surviving paths in respective states are selected according to a so-called path metric transition diagram, and the path metrics of the surviving paths are calculated. This path metric transition diagram is prepared based on the trellis diagram as shown in FIG. 10.

FIGS. 11A and 11B show path metric transition diagrams when codes indicated by the trellis diagram shown in FIG. 10 are used. That is to say, in the trellis diagram shown in FIG. 10, there are two paths that become confluent in the state (00), one of which is generated by an output of a code (00) from the state (00) and the other of which generates a code (11) from the state (01). Therefore, the path metric PM00(new) in the current state (00) is expressed by one of the following two formulae:

$$PM00(new)a=PM00(old)+BM00$$

$$PM00(new)b=PM01(old)+BM11$$

where PM00(old) and PM01(old) indicate path metrics of the preceding states and BM00 and BM11 denote branch metrics.

In other words, a maximum likelihood value of two path metrics PM00(new)a and PM00(new)b during the ACS operation is selected and the path metric thus selected is determined as the path metric PM00(new) of the current state (00).

There are two paths that become confluent in the state (10), one of which is generated by an output of a code (11) from the state (00) and the other of which generates a code (00) from the state (01). Therefore, the path metric PM10(new) in the current state is expressed by one of the following two formulae.

$$PM10(new)a=PM00(old)+BM11$$

$$PM10(new)b=PM01(old)+BM00$$

Further, there are two paths that become confluent in the state (01), one of which is generated by an output of a code (01) from the state (10) and the other of which generates a code (10) from the state (11). Therefore, the path metric PM01(new) in the current state is expressed by one of the following two formulae.

PM01(new)a=PM10(old)+BM01

PM01(new)b=PM11(old)+BM10

Furthermore, there are two paths that become confluent in the state (11), one of which is generated by an output of a code (10) from the state (10) and the other of which generates a code (01) from the state (11). Therefore, the path metric PM11(new) in the current state is expressed by one of the following two formulae.

PM11(new)a=PM10(old)+BM10

PM11(new)b=PM11(old)+BM01

Based on the above, the path metric transition diagrams as shown in FIGS. 11A and 11B can be prepared.

As can be seen from the above formulae and the path metric transition diagrams shown in FIGS. 11A and 11B, the difference between PM00(new) and PM10(new) is only the correspondence between PMxx(old) and BMxx when BM11 and BM00 are added to PM00(old) and PM01(old).

Similarly, the difference between PM01(new) and PM11 (new) also is only the correspondence between PMxx(old) and BMxx when BM01 and BM10 are added to PM10(old) and PM11(old).

Furthermore, the two PMxx(old) in each case described above have the relationship of continuous even and odd number states and the two PMxx(new) have the relationship of upper and lower order states in which only their most significant bits differ from each other.

These facts indicate that two PMxx(new) with the relationship of the upper and lower order states can be calculated from the two BMxx and the two PMxx(old) with the relationship of continuous even and odd number states.

Next, the following description is directed to path selection signals and respective state transitions. In the above description, the pair of path metrics to be determined as current states have the relationship that only the least significant bits of their preceding states are different from each other. Based on this, maximum likelihood path metric selection information (path selection signals) of the respective states is indicated as PS00(new), PS01(new), PS10 (new) and PS11(new), and the relationships between their values and path metric selections are assumed as follows.

PSxx(new)=0→PMxx(new)a is selected.

PSxx(new)=1→PMxx(new)b is selected.

In this case, the values of respective PSxx(new) are the same as those of the least significant bits of the corresponding states at the preceding time point.

In other words, when a state at a time point n is indicated as S(n) and a path selection signal in the state S as PS(S), the relationship between the respective states at time points n and n−1 and the path selection signal is expressed as follows.

S(n−1)={S(n), PS(S)}

In the above formula, {a, b} denotes an operation of concatenating b to the least significant bit side of a and deleting a part of the most significant bit side of a with a width corresponding to a bit width of b.

Such facts indicate that the preceding state of a certain state can be determined from the path selection signal of the certain state.

From the above formula, in the case where the maximum likelihood state at a time point n is determined when a predetermined number of path selection signals are stored, the states selected in the past can be determined from the values of the path selection signals at respective time points. This operation is referred to as "trace-back" and one example is shown in FIG. 12.

In some cases, in order to determine the maximum likelihood state at a time point n, a method may be employed in which an additional bit (a tailbit) is added to an information bit so that the state of the encoder is converged to a predetermined value (for instance, 00 or the like) at the end of the convolutional code sequence.

As described at the beginning of this specification, the state transitions in the convolutional encoder are caused by successive inputs of information bits to the delay elements. Therefore, the determination of the state transitions by trace-back to the past states means the direct determination of the information bits.

Through the above-mentioned processes, the information bits can be decoded from the received code sequence by Viterbi decoding.

In a conventional Viterbi decoder, it is known that the ACS operation is executed by time-sharing processing and a RAM (a random access memory) is used as a path metric memory for storing a path metric obtained from a result of the ACS operation. In such a Viterbi decoder, the path metric that is obtained from a result of the ACS operation and is to be used for the ACS operation at a subsequent time point is allocated to one address of the RAM. In other words, a path metric of one state is assigned to one address of one RAM.

In this case, since a new path metric is generated from path metrics of two past states, it is required to access the memory three times per ACS operation to read out two past path metrics and write one new path metric. Even when using a so-called dual port RAM to operate writing and readout separately and concurrently, the readout is required twice. Therefore, many times of accessing memory are necessary and a high speed RAM is required, which hinder the reduction in power consumption and the increase in speed.

As a further improved method, JP 9-232973 A discloses a calculation method in which, based on the fact that two PMxx(new) with a relationship of upper and lower order states can be calculated from two BMxx and two PMxx(old) with a relationship of continuous even and odd number states as described above, two path metrics are read out and two path metrics are calculated to be output. In this method, two memories are provided for the upper orders and lower orders of the path metrics, respectively, and an arrangement for reading out continuous even and odd numbers of the path metrics at a time is provided, thus calculating two path metrics by one-time readout and one-time writing.

In this method, however, it is necessary to prepare two path metric memories for the ACS operation. Generally, when one memory is divided to provide memories with the same capacity, the circuit size and area increase, which causes a disadvantage for the reduction in power consumption.

Next, the following description is directed to the traceback. In view of the fact that the preceding state of a certain state can be determined from the path selection signal of the certain state as described above, a configuration used for executing the trace-back by allowing path selection signals for n states (for example, 16 states=1 word) to be stored in one address of a memory (a path selection signal memory) storing the path selection signals is shown in FIG. 13A.

In this configuration, it is important that an address of a path selection signal memory is determined from a Viterbi state and furthermore, the next Viterbi state can be determined from a path selection signal read out from the memory. In other words, the determination of an address and memory access must be executed during one processing unit (one cycle). Generally, operation delays in the memory are indicated as in FIG. 13B. The operation delays include initially, an address delay caused by wiring indicated as a delay A and next, an output delay in the memory and a data delay caused by wiring, which are indicated as a delay C. These operation delays are rather long in general.

Therefore, the upper limit of the speed of the trace-back operation is determined as shown in FIG. 13C. In addition to the delays A and C described above, delays B and D also are included, which relate to a selector for extracting a path selection signal for one state from one word read out from the path selection signal memory. With consideration to the setup time of a shift register for storing Viterbi states, the upper limit of the operation speed is determined depending on a longer delay out of the following two delays.

(1) Delay around the path selection signal memory: Delay A+Delay C+Delay D
(2) Delay around the selector: Delay B+Delay D As can be understood from the above, the delay around the path selection signal memory is longer than the other, which limits the operation speed, thus causing a difficulty in high speed trace-back.

In order to solve this problem, there is a method in which a high speed operation is achieved using a register file as the path selection signal memory or the like. However, such a method causes an increase in circuit size and area and a disadvantage in attempting to reduce power consumption.

SUMMARY OF THE INVENTION

The present invention is intended to provide a Viterbi decoder in which while using conventional memories such as a RAM or the like for a path metric memory and a path selection signal memory, an ACS operation with a reduced number of times the memory is accessed and a high speed trace-back operation are executed. Thus the reduction in power consumption and the increase in speed of a Viterbi decoding operation can be achieved.

In order to achieve the above-mentioned object, a first Viterbi decoder of the present invention includes a branch metric operation section, an add-compare-select (ACS) operation section, a path metric permutation section, and a path metric memory. The branch metric operation section calculates branch metrics based on input codes. The ACS operation section calculates path metrics of respective states by time-sharing processing based on the branch metrics calculated by the branch metric operation section. The path metric permutation section temporarily delays the path metrics sequentially calculated by and output from the ACS operation section and permutates the path metrics to have different time series from those of the path metrics output from the ACS operation section. The path metric memory stores path metrics output from the path metric permutation section.

In the first viterbi decoder, it is preferable that the path metric memory stores, reads out, and writes path metrics of continuous even number states and path metrics of continuous odd number states, as one storage unit per address.

In the first Viterbi decoder, it is preferable that the path metric permutation section temporarily delays time series of plural pairs of path metrics of upper order states and path metrics of lower order states calculated by the ACS operation section and permutates the path metrics to obtain time series of plural pairs of path metrics of continuous even number states and path metrics of continuous odd number states.

In the first Viterbi decoder, it is preferable that using the path metric permutation section for temporarily delaying time series of plural pairs of path metrics of upper order states and path metrics of lower order states calculated by the ACS operation section and permutating the path metrics to obtain time series of plural pairs of path metrics of continuous even number states and path metrics of continuous odd number states, four path metrics are updated by two-time readouts and two-time writings with respect to the path metric memory alone.

In the first Viterbi decoder, it is preferable that the ACS operation section also selects a maximum likelihood path in combination with a path metric at a preceding time point and generates a path selection signal as information of the path thus selected (a surviving path), the first Viterbi decoder further includes a path selection signal memory for storing the path selection signal and a trace-back operation section for searching past state transition using a past path selection signal read out from the path selection signal memory and outputting decoded data, and the trace-back operation section includes a Viterbi state memory for storing a Viterbi state following the surviving path based on the path selection signal obtained from the path selection signal memory, a Viterbi state prediction section for predicting a part of a Viterbi state to be updated next based on contents of the Viterbi state memory, and a path selection signal memory address calculation section for calculating an address of the path selection signal memory storing the path selection signal based on the part of the Viterbi state predicted by the Viterbi state prediction section.

It also is preferable that the Viterbi state prediction section includes an up/down counter for changing a state according to a readout control signal of the path selection signal memory and a shift control signal of the Viterbi state memory and a selector for changing a correspondence between the contents of the Viterbi state memory and the part of the Viterbi state to be updated next according to a value of the up/down counter.

Furthermore, it is preferable that pipeline processing is employed in at least one stage selected from a stage where the path selection signal memory address calculation section calculates an address based on the part of the Viterbi state predicted by the Viterbi state prediction section, a stage where based on the address thus calculated the path selection signal is read out from the path selection signal memory, and a stage where based on the path selection signal thus read out the Viterbi state following the surviving path is stored in the Viterbi state memory.

In order to achieve the above-mentioned object, a second Viterbi decoder of the present invention includes a branch metric operation section, an add-compare-select (ACS) operation section, a path metric permutation section, a path metric/path selection signal common memory, a trace-back operation section, and an address generation/memory control section. The branch metric operation section calculates branch metrics based on input codes. The ACS operation section calculates path metrics of respective states by time-sharing processing based on the branch metrics calculated by the branch metric operation section, selects a maximum likelihood path in combination with a path metric at a preceding time point, and generates a path selection signal as information of the maximum likelihood path thus selected (a surviving path). The path metric permutation section temporarily delays path metrics sequentially calculated by and output from the ACS operation section and permutates the path metrics to have different time series from those of the path metrics output from the ACS operation section. The path metric/path selection signal common memory stores path metrics and path selection signals. The trace-back operation section searches past state transition using a past path selection signal read out from the path metric/path selection signal common memory and outputs decoded data. The trace-back operation section includes a Viterbi state memory for storing a Viterbi state following the surviving path based on the path selection signal obtained from the path metric/path selection signal common memory, a Viterbi state prediction section for predicting a part of a Viterbi state to be updated next based on contents of the Viterbi state memory, and a path selection signal memory address calculation section for calculating an address of the path selection signal memory storing the path selection signal based on the part of the Viterbi state predicted by the Viterbi state prediction section. The address generation/memory control section receives path metrics from the path metric permutation section and the path selection signal from the ACS operation section, generates and writes a specific address with respect to the path metric/path selection signal common memory, reads out the path metrics and the path selection signal that are stored in the path metric/path selection signal common memory, and supplies the path metrics to the ACS operation section and the path selection signal to the trace-back operation section. The ACS operation section, the path metric operation section, and the trace-back operation section access the path metric/path selection signal common memory in a time sharing manner by the address generation/memory control section.

According to the above-mentioned configuration, the ACS operation in the Viterbi decoder is executed by time-sharing processing and the sequences of path metric states to be written in the path metric memory or the path metric/path selection signal common memory are changed using the path metric permutation section. In addition, in the Viterbi decoder, the path selection signal from the path selection signal memory or the path as metric/path selection signal common memory is read out by pipeline processing using the Viterbi state prediction section, thus executing the trace-back operation. As a result, the number of memory accesses in the ACS operation is reduced and the trace-back operation can be executed at a high speed, thus allowing power consumption to be reduced and the Viterbi decoding process to be accelerated.

In other words, the ACS operation in the Viterbi decoder is executed by the time-sharing processing and the sequences of the path metric states to be written in the path metric memory are changed using the path metric permutation section. Therefore, using one memory, four path metrics can be calculated by four-time memory accesses. Consequently, the number of memory accesses required per process in the ACS operation can be reduced, the Viterbi decoding operation can be accelerated, and the power consumption can be reduced.

Furthermore, the Viterbi state prediction section is provided in the trace-back operation section in the Viterbi decoder to execute the readout from the path selection signal memory by the pipeline processing. Therefore, while a conventional memory such as a RAM or the like is used for the path selection signal memory, a high speed trace-back operation can be achieved, thus accelerating the Viterbi decoding operation and reducing the power consumption.

Moreover, an address generation/memory control section is provided so that one RAM is shared among the ACS operation section, the path metric permutation section, and the trace-back operation section. Consequently, a Viterbi decoder in which the use of the RAM is minimized can be obtained.

BRIEF DESCRIPTION OF THE DRAWINGS

FIG. 5B is a table showing the relationship of a path selection data read signal, a shift register shift signal, and a value of an up/down counter 502.

FIG. 5C is a table showing the relationship between a value of the up/down counter 502 and a word address selected by a selector 501.

DETAILED DESCRIPTION OF THE INVENTION

Preferred embodiments according to the present invention are described with reference to the drawings as follows.

Figure 1:
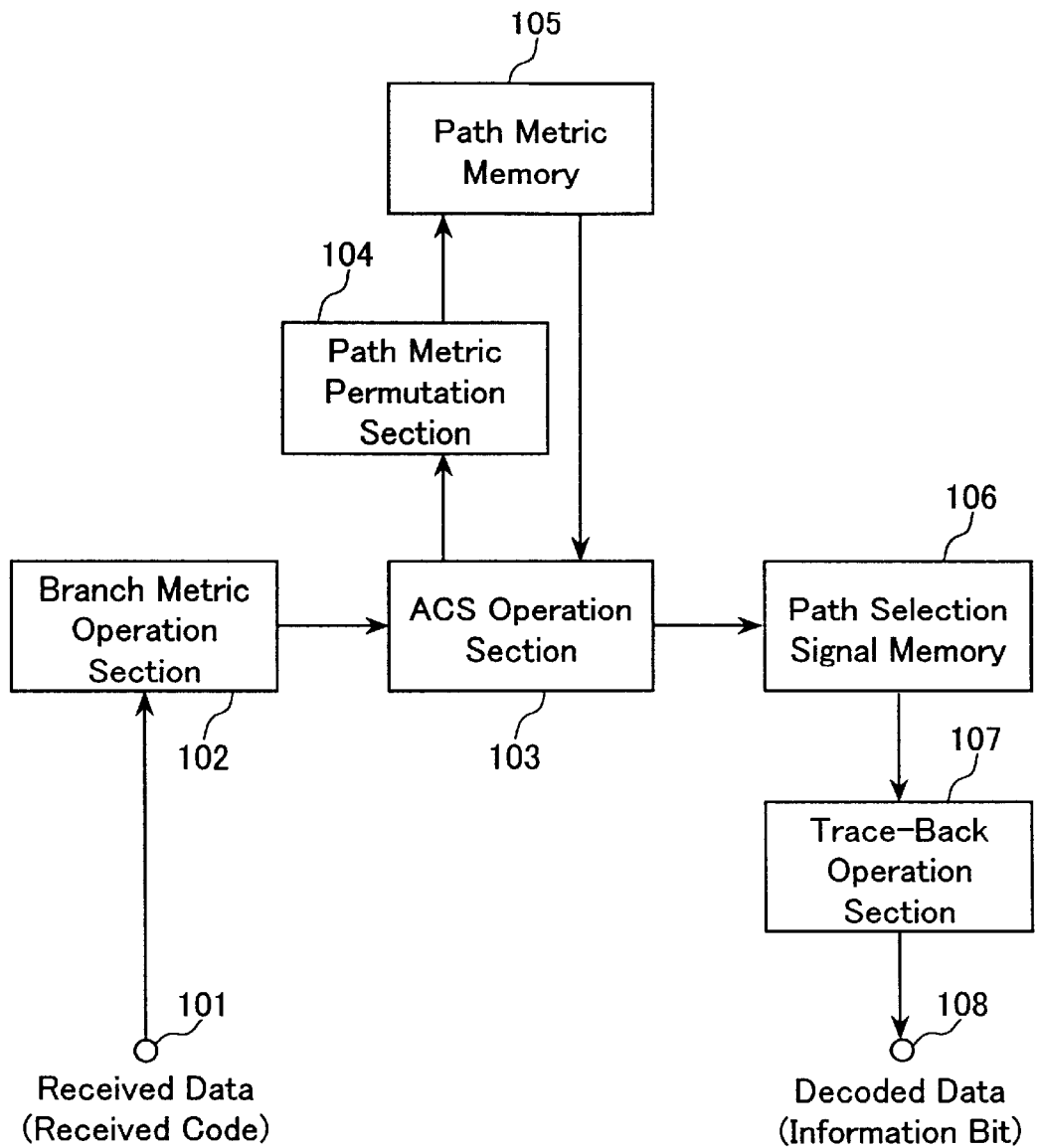
FIG. 1 is a block diagram showing a schematic configuration of a Viterbi decoder according to an embodiment of the present invention.

FIG. 1 is a block diagram showing a schematic configuration of a Viterbi decoder according to an embodiment of the present invention.

Generally, using a vlterbi algorithm, a Viterbi decoder selects a combination (a path) of maximum likelihood (most likely) branches selected from two respective branches of respective states to select a surviving path until its predetermined length is obtained and detects a maximum likelihood path out of paths selected in the respective states, thus decoding received codes.

As shown in FIG. 1, a Viterbi decoder for decoding convolutional codes based on such a Viterbi algorithm basically includes a branch metric operation section 102, an ACS (add-compare-select) operation section 103, a path metric permutation section 104, a path metric memory 105, a path selection signal memory 106, and a trace-back operation section 107. The branch metric operation section 102 calculates metrics between sequences of received data (received sequences) from a terminal 101 and the above-mentioned respective branches. The ACS operation section 103 selects surviving paths and calculates path metrics of the surviving paths. The path metric permutation section 104 temporarily delays the path metrics sequentially calculated by and output from the ACS operation section 103 and permutates the path metrics to have different time series from those of the path metrics output from the ACS operation section 103. The path metric memory 105 stores path metrics of respective states. The path selection signal memory 106 stores information of selected paths (path selection signals). The trace-back operation section 107 searches past state transition using past path selection signals read out from the path selection signal memory 106 and outputs decoded data from a terminal 108.

First, an ACS operation in the ACS operation section 103 is described as follows.

The following description is directed to a specific example of convolutional encoding and Viterbi decoding when a constraint length K=9 and a code rate R=½. When the constraint length K=9, the number of states is $2^{K-1}$, i.e. when K=9, the number of states is $2^8$=256. These 256 states are indicated as "00" to "FF" using two digits hexadecimal notations and the path metric of a state xx is indicated as PM[xx]. A path metric of a new state is indicated as PM[xx](new) and a path metric of a state at the preceding time point as PM[xx](old).

Figure 11A:
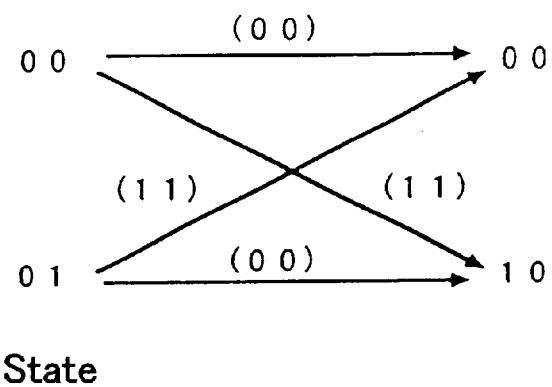
FIGS. 11A and 11B are path metric transition diagrams for explaining the Viterbi decoding.
Figure 11B:
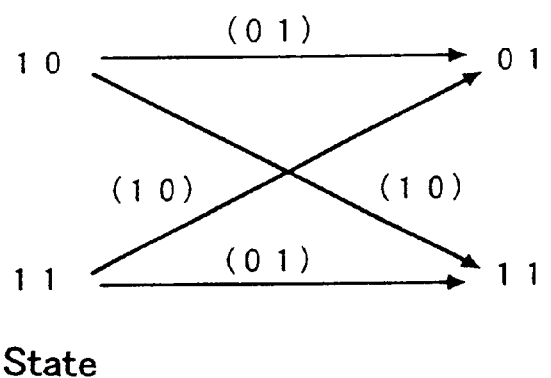
Figure 12:
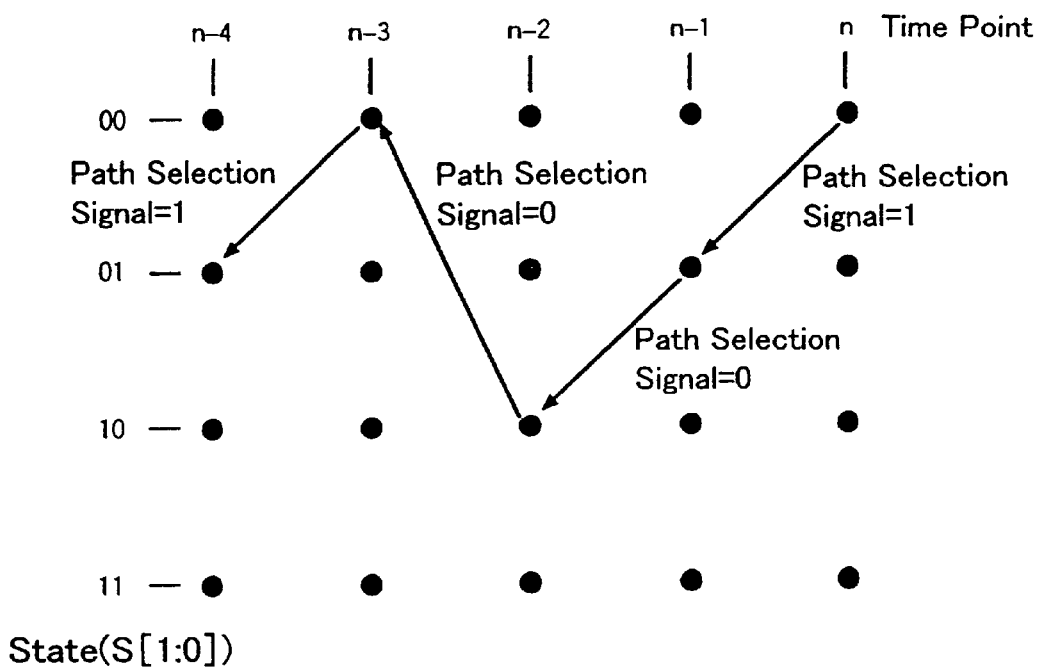
FIG. 12 is a state transition diagram for explaining the trace-back operation.
Figure 13A:
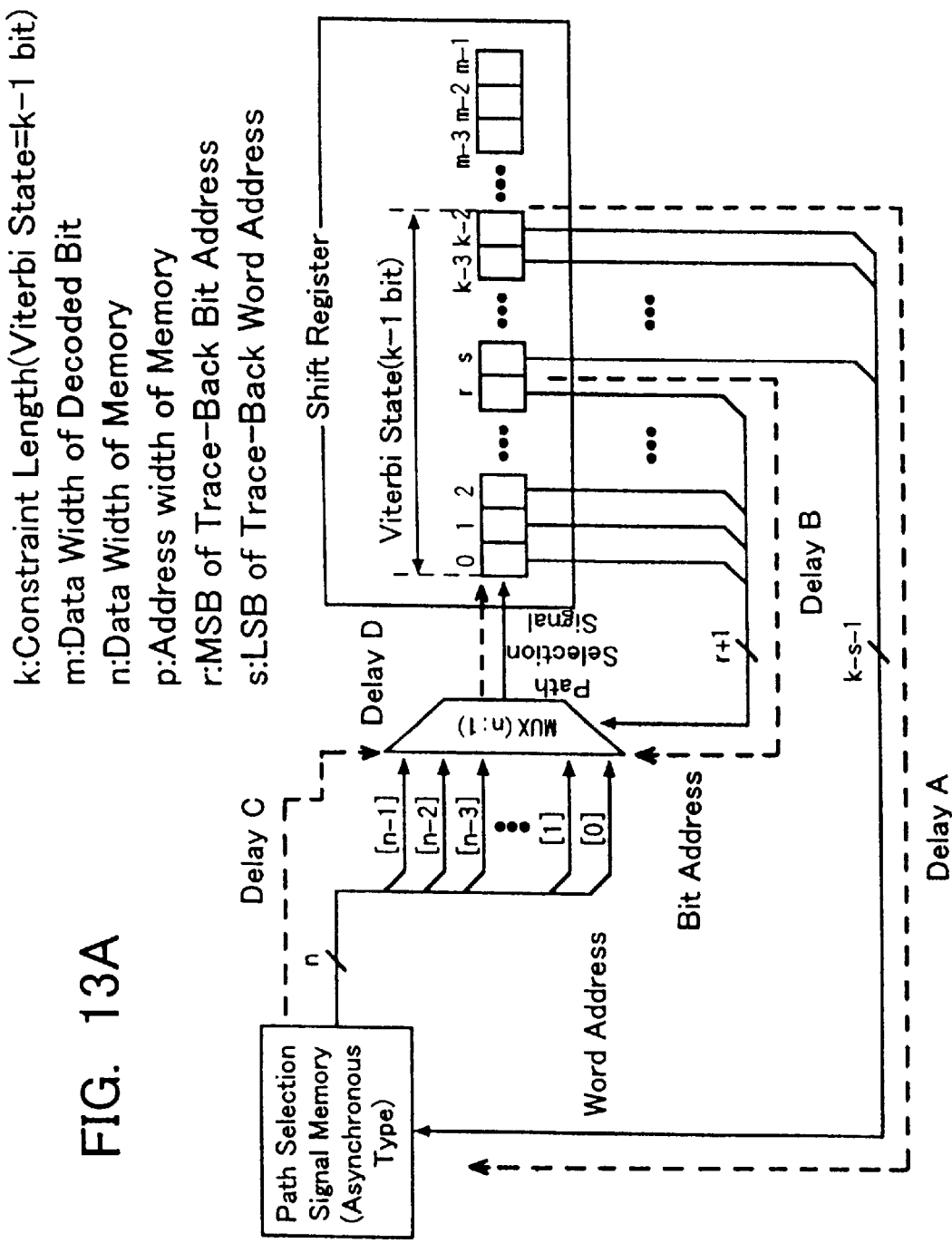
FIG. 13A is a block diagram showing a specific configuration example of a conventional trace-back operation.
Figure 13B:
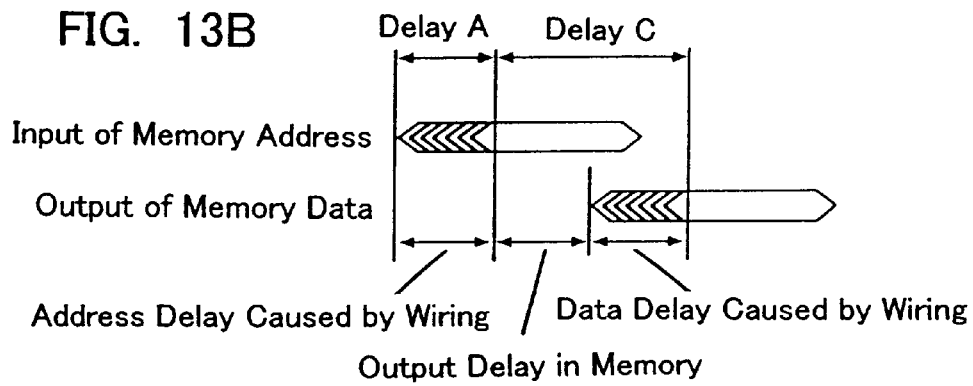
FIG. 13B is a timing chart showing operational delays of respective signals shown in FIG. 13A.
Figure 13C:
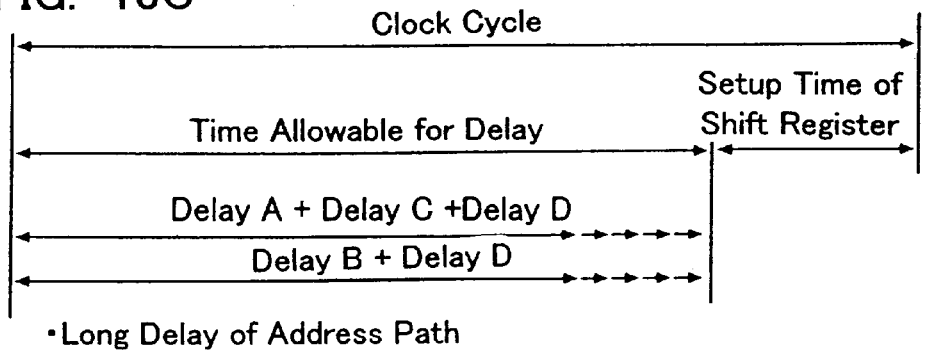
FIG. 13C is a schematic diagram showing operational delays determining the upper limit of a speed of the trace-back operation shown in FIG. 13A.

When the constraint length K=9 and the code rate R=½, in the ACS operation, a maximum likelihood path is selected out of two paths subjected to transition to respective states. For example, as shown in FIGS. 11A and 11B, paths for transition to a new state 00 (new) are two paths from states 00 (old) and 01 (old) at a preceding time point. For the transition to the state 00 (new) from the preceding states 00 (old) and 01 (old), the received codes (G0, G1) are required to be, for example, (00) and (11), respectively.

These expected two received codes are determined uniquely according to generating polynomials of a convolutional encoder with respect to the respective states xx (new). The two received codes denote those expected "when "0" is input to the convolutional encoder as an information bit" and "when "1" is input to the convolutional encoder as an information bit".

Therefore, in the branch metric operation section 102, metrics (branch metrics) of respective received code patterns are determined and in the ACS operation section 103, a maximum likelihood of a path is determined in combination with a metric (a path metric) at a preceding time point to select a surviving path and a path metric for the subsequent time point is stored and retained in the path metric memory 105.

When branch metrics and path metrics in the case where "0" and "1" are input to the convolutional encoder as information bits in the state xx are indicated as BM0[xx] and BM1[xx], and PM0[xx] and PM1[xx], respectively, the correspondence between the path metric and the maximum likelihood is indicated as:

Large path metric→High maximum likelihood

Small path metric→Low maximum likelihood, and in the case of transitions to the state 00 from the states 00 and 01, the calculations in the above-mentioned case are expressed as follows:

PM0[00](new)=PM[00](old)+BM0[00]

PM1[00](new)=PM[01](old)+BM1[00]

PM[00](new)=max(PM0[00](new), PM1[00](new)).

In the above calculation, max(x, y) indicates an operation for selecting a higher value out of x and y.

With respect to PM[80](new) in which only the most significant bits are different, the calculations are expressed as follows.

PM0[80](new)=PM[00](old)+BM0[80]

PM1[80](new)=PM[01](old)+BM1[80]

PM[80](new)=max(PM0[80](new), PM1[80](new)).

In the case of transitions to the state 01 from the states 02 and 03, the calculations are expressed as follows.

PM0[01](new)=PM[02](old)+BM0[01]

PM1[01](new)=PM[03](old)+BM1[01]

PM[01](new)=max(PM0[00](new), PM1[00](new)).

With respect to PM[81](new) in which only the most significant bits are different, the calculations are expressed as follows.

PM0[81](new)=PM[02](old)+BM0[81]

PM1[81](new)=PM[03](old)+BM1[81]

PM[81](new)=max(PM0[80](new), PM1[80](new)).

Furthermore, when the generating polynomials of the convolutional encoder are:

G0(D)=1+ . . . +$D^{K-1}$

G1(D)=1+ . . . +$D^{K-1}$, i.e. when the generating polynomials have members 1 and $D^{K-1}$, respectively, the bits of codes always are inverted logically by the inputs of "0" and "1" of information bits and therefore, code distances in the case of the inputs of "0" and "1" have a symmetric relationship. In this case, with respect to the branch metrics as to the states in which only their most significant bits are different, the following relationships hold.

BM0[80]=BM1[00]

BM1[80]=BM0[00]

BM0[81]=BM1[01]

BM1[81]=BM0[01]

Using these relationships, the relationships of the above-mentioned path metrics are expressed as follows.

PM0[00](new)=PM[00](old)+BM0[00]

PM1[00](new)=PM[01](old)+BM1[00]

PM[00](new)=max(PM0[00](new), PM1[00](new))

PM0[80](new)=PM[00](old)+BM1[00]

PM1[80](new)=PM[01](old)+BM0[00]

PM[80](new)=max(PM0[80](new), PM1[80](new))

PM0[01](new)=PM[02](old)+BM[01]

PM1[01](new)=PM[03](old)+BM1[01]

PM[01](new)=max(PM0[00](new), PM1[00](new))

PM0[81](new)=PM[02](old)+BM1[01]

PM1[81](new)=PM[03](old)+BM0[01]

PM[81](new)=max(PM0[80](new), PM1[80](new))

In other words, from the above formulae, it is understood that from four path metrics of continuous even and odd number states of PM[00](old), PM[01](old), PM[02](old), and PM[03](old), two pairs of path metrics, each of which includes two path metrics of continuous even and odd number states of PM[00](new) and PM[01](new) or PM[80](new) and PM[81](new), can be obtained.

In the present embodiment, using the path metric permutation section 104, four path metrics obtained sequentially from the ACS operation section 103 are permutated to two pairs of path metrics, each of which includes two path metrics of continuous even and odd number states.

Furthermore, the present embodiment is configured so that using a RAM (a random access memory) as the path metric memory 105, the path metrics of continuous even and odd number states are stored as one storage unit per address of the RAM. Therefore, with the following four memory accesses, four path metrics are updated.

(1) Read out of PM[00](old) and PM[01](old) and calculation of PM[00](new) and PM[80](new)

(2) Read out of PM[02](old) and PM[03](old) and calculation of PM[01](new) and PM[81](new)

(3) Writing of PM[00](new) and PM[01](new)

(4) Writing of PM[80](new) and PM[81](new)

This updating is executed for 256 states with respect to PM[00] to PM[FF].

Figure 2A:
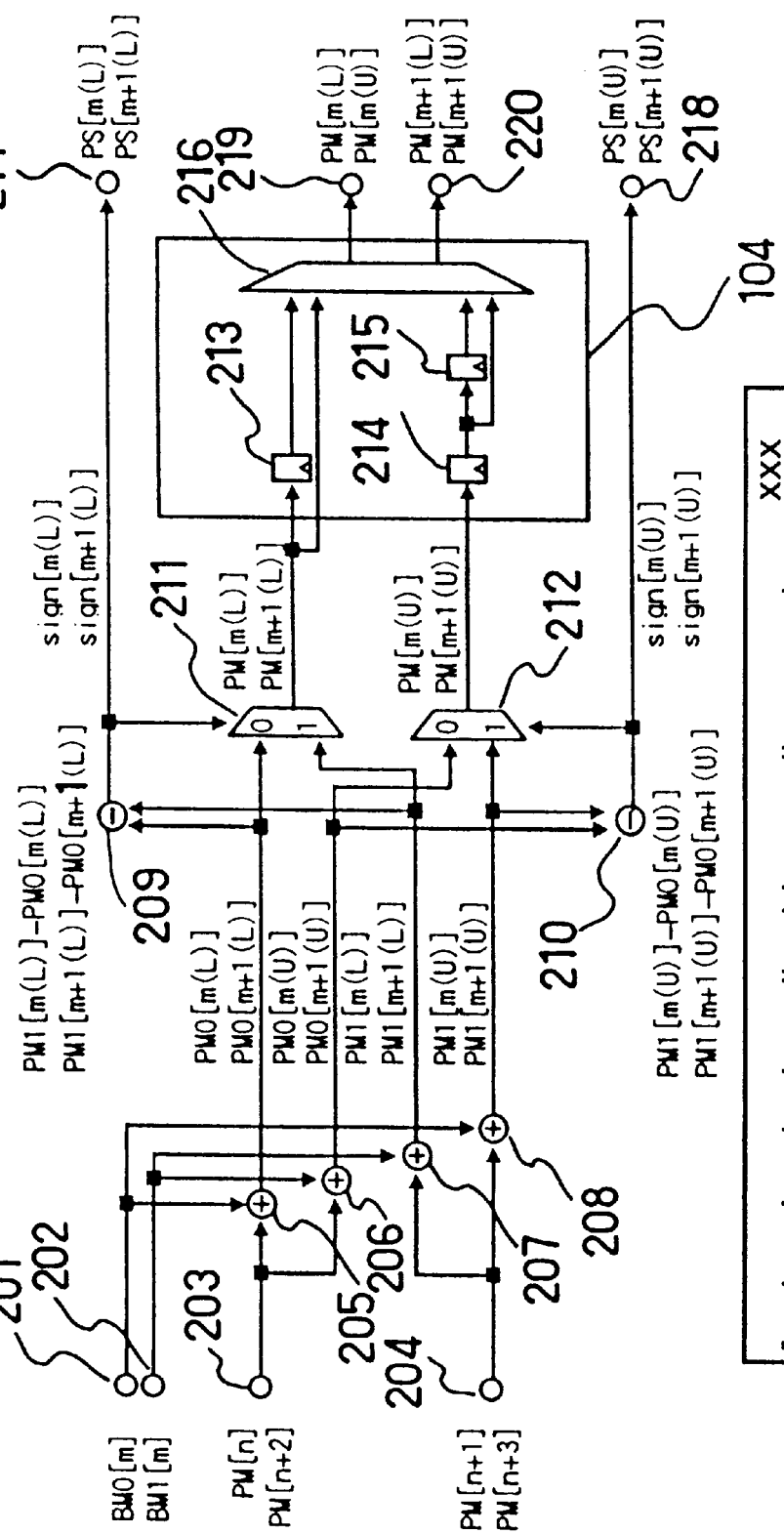
FIG. 2A is a block diagram showing configurations of an ACS operation section and a path metric permutation section.

Specifically, path metrics are updated, for example, as shown in FIG. 2A.

Figure 9:
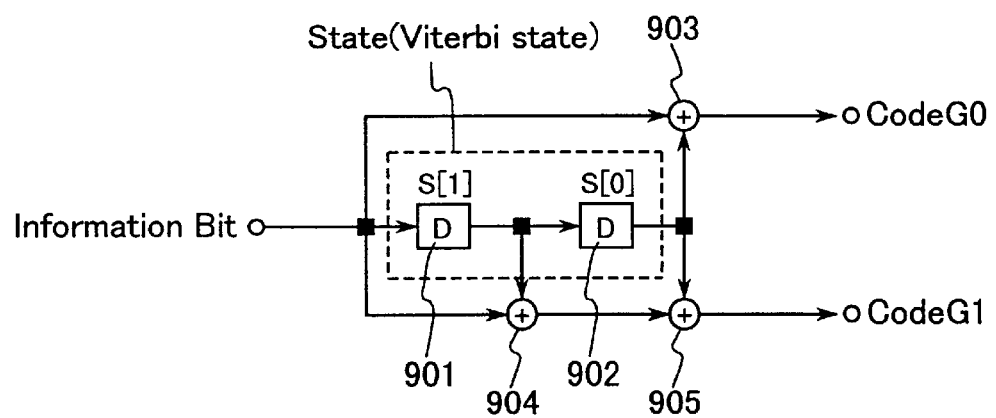
FIG. 9 is a block diagram showing an example of a convolutional encoder.
Figure 10:
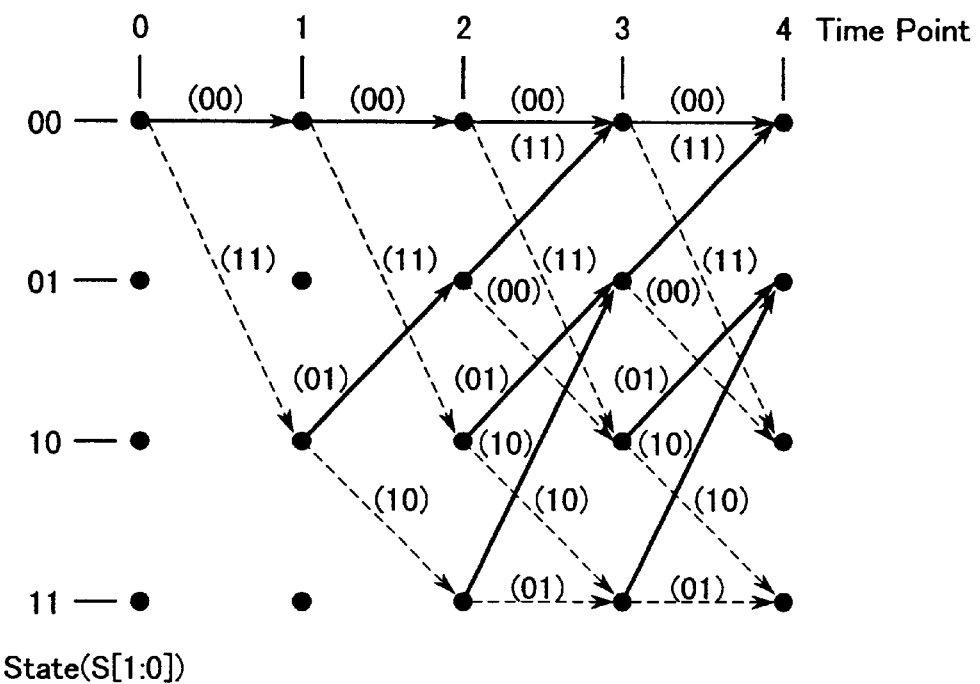
FIG. 10 is a trellis diagram for explaining Viterbi decoding.

In FIG. 2A, a state (old) is indicated as n, a state (new) as m, and an upper state and a lower state in the state (new) are indicated as m(U) and m(L), respectively. The upper state and the lower state are defined as follows. As shown in FIG. 9, in the case where the input side of an information bit is the most significant bit of the state, with respect to a pair of states with the same bit except for their most significant bits, the "upper state" is the state with "1" as the most significant bit and the "lower state" is the state with "0" as the most significant bit. For example, in the path metric transition diagrams shown in FIGS. 11A and 11B, the state "00" after state transition is the lower state and the state "10" is the upper state. In this connection, the upper and lower states also can be defined in the case where the input side of an information bit is the least significant bit of the state, which is mathematically the same as the above-mentioned definition.

Initially, branch metrics BM0[m] and BM1[m] are input from terminals 201 and 202, and path metrics PM[n] and PM[n+1] of continuous even and odd number states are input from terminals 203 and 204, respectively.

Next, adders 205, 206, 207 and 208 calculate path metrics PM0[m(L)] and PM1[m(L)] of lower states and PM0[m(U)] and PM1[m(U)] of upper states.

Subtracters 209 and 210 compare PM0[m(L)] with PM1[m(L)] and PM0[m(U)] with PM1[m(U)], respectively. In the subtraction results from the subtracters 209 and 210, code bits represent the comparison results. A code bit "sign[m(L)]" of the result of comparison between PM0[m(L)] and PM1[m(L)] and a code bit "sign[m(U)]" of the result of comparison between PM0[m(U)] and PM1[m(U)] are used as selection signals in selectors 211 and 212 described later and also are output from terminals 217 and 218 as path selection signals PS[m(L)] and PS[m(U)], respectively.

Path metrics with high likelihood are calculated as PM[m(L)] and PM[m(U)] by the selectors 211 and 212. These path metrics are delayed temporarily by delay elements 213, 214, 215 of flip-flops and the like in the path metric permutation section 104.

Similarly, from the path metrics PM[n+2] and PM[n+3] of continuous even and odd number states, path selection signals PS[m+1(L)] and PS[m+1(U)] and path metrics PM[m+1(L)] and PM[m+1(U)] are calculated.

As a next step, the path metrics PM[m+1(L)] and PM[m+1(U)] together with the PM[m(L)] and PM[m(U)] that have been delayed are permutated and are selected by the selector 216 as a pair of PM[m(L)] and PM[m+1(L)] and a pair of PM[m(U)] and PM[m+1(U)], which then are output from the terminals 219 and 220.

Figure 2B:
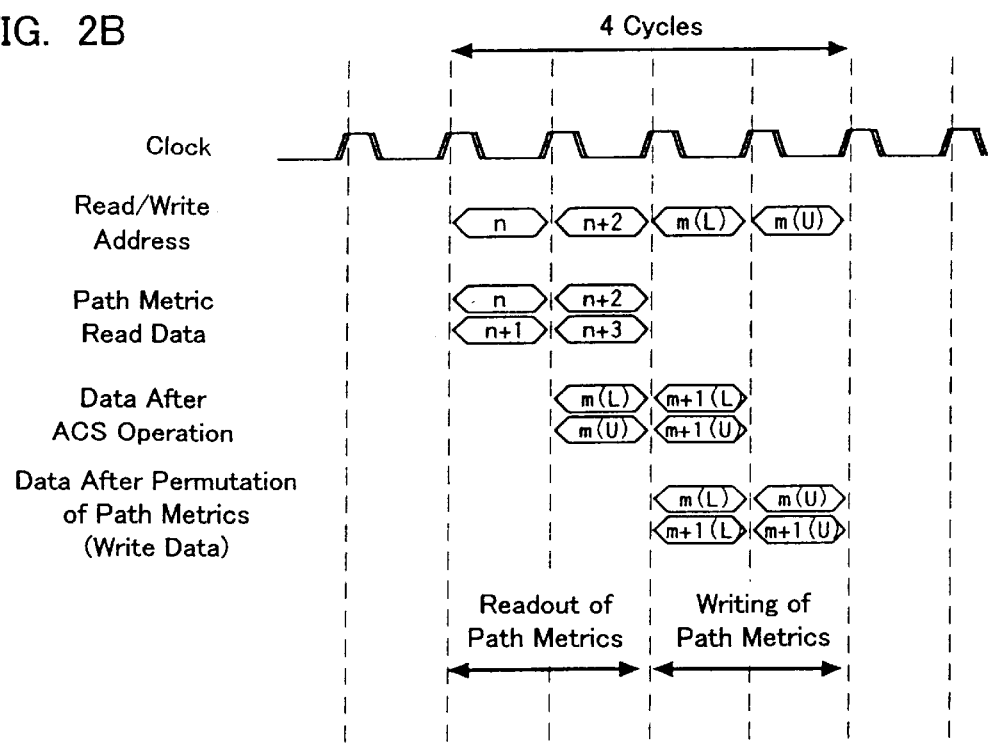
FIG. 2B is a timing chart showing operations of the respective sections shown in FIG. 2A.

The above-mentioned operations are illustrated in a timing chart shown in FIG. 2B. From the timing chart, it can be seen that in the four cycle operations, operations of reading out and writing of the path metrics are executed in two cycles, respectively. Such a configuration allows the frequency of memory accesses in the ACS operation to be reduced.

The trace-back operation is described as follows.

Figure 3A:
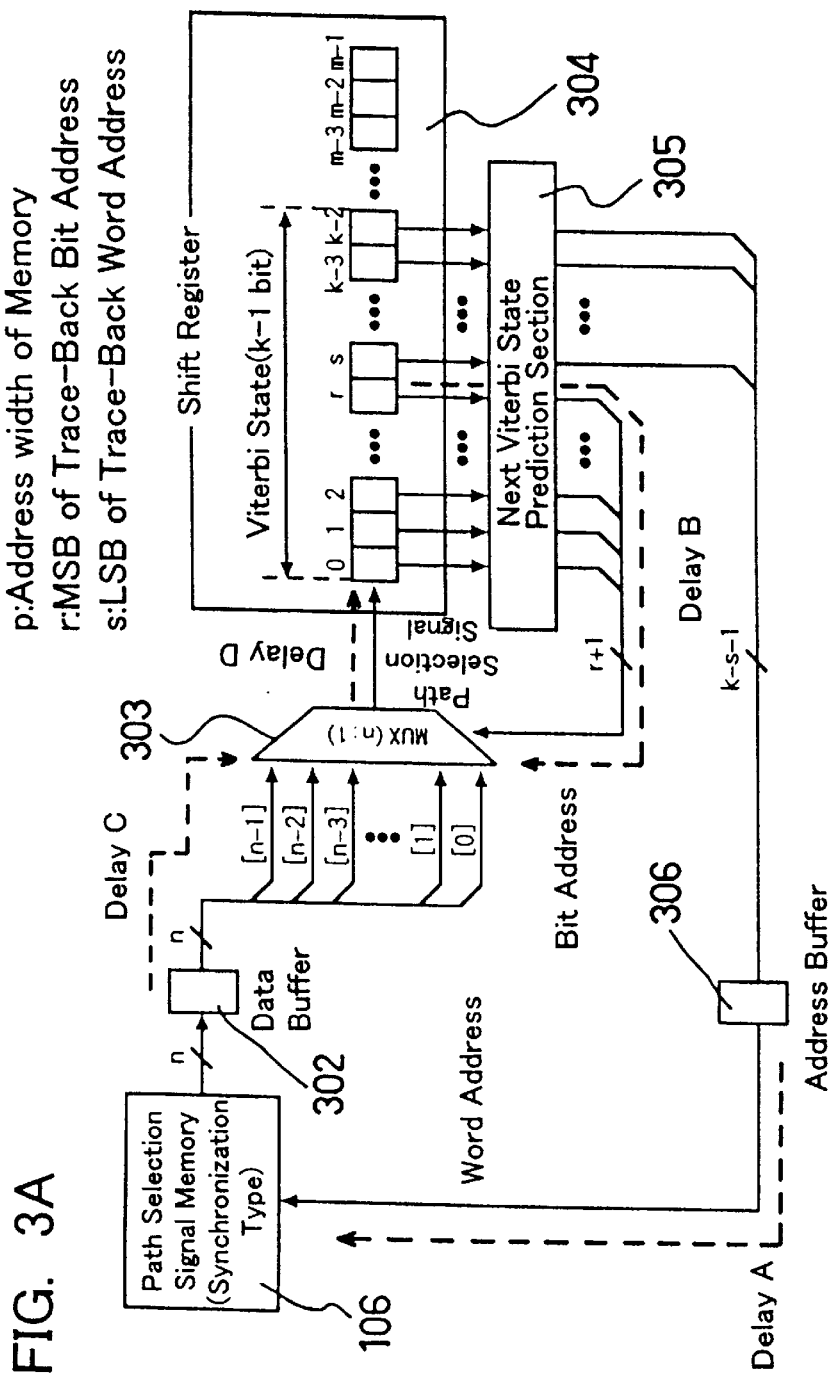
FIG. 3A is a block diagram showing a specific configuration example of a trace-back operation.

FIG. 3A is a block diagram showing a specific configuration example of the trace-back operation. In FIG. 3A, sections except for the path selection signal memory 106 for storing path selection signals are included in the trace-back operation section 107. That is to say, the trace-back operation section 107 includes a data buffer 302, a selector 303, a shift register 304, a next Viterbi state prediction section 305, and an address buffer 306. The data buffer 302 temporarily delays path selection signal data (with n bit width) including path selection signals for a plurality of states (n states). The selector 303 extracts a path selection signal (with one bit width) for one state from the path selection signal data. The shift register 304 updates a Viterbi state by the path selection signal. The next Viterbi state prediction section 305 predicts a part of a Viterbi state to be updated next from the Viterbi state. The address buffer 306 temporarily delays a path selection signal memory address calculated by and output from the next Viterbi state prediction section 305.

The shift register 304 indicates the Viterbi state as well as a decoding bit obtained from transition of the Viterbi state.

An important point in the above configuration is the following improvement. In a conventional operation, it is necessary in the trace-back process that based on a Viterbi state updated in the shift register 304, path selection signal data are read out from the path selection signal memory 106 and the shift register 304 is updated in the next cycle by the path selection signal extracted from the path selection signal data. In the present embodiment, however, a Viterbi state to be updated next is predicted, and a predicted path selection signal memory address is calculated by the next Viterbi state prediction section 305 provided additionally in the present embodiment, thus achieving the trace-back process using the address buffer 306 and the data buffer 302 for temporarily delaying the path selection signal memory address and the path selection signal data, respectively.

Figure 3B:
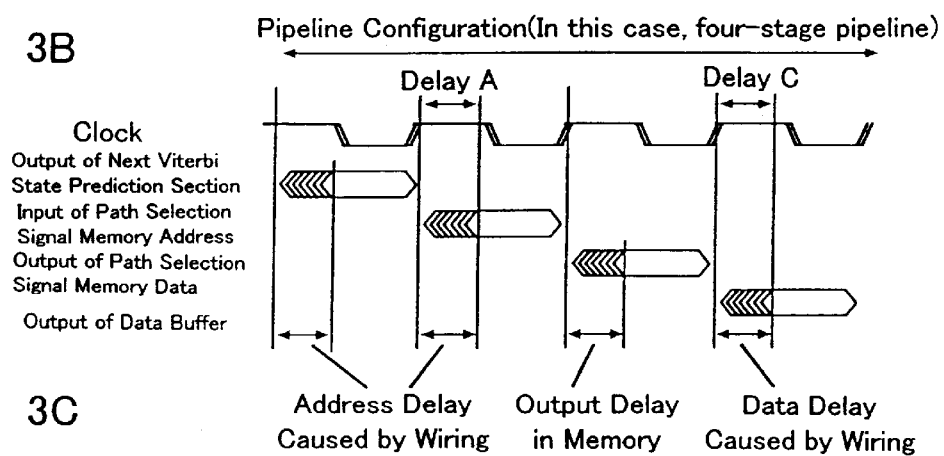
FIG. 3B is a timing chart showing operational delays of respective signals shown in FIG. 3A.

The following description is directed to advantages in the abovementioned improvement. FIG. 3B is a timing chart showing the delays of respective signals in the above-mentioned configuration. The timing chart includes a clock as a reference, an output of the next Viterbi state prediction section, an input of the path selection signal memory address, an output of the path selection signal memory data, and an output of the data buffer, sequentially. The respective signals include an address delay caused by wiring, an output delay in the path selection signal memory, and a data delay caused by wiring. In these delays, delays A and C shown in FIG. 3A are divided in a pipeline operation as shown in FIG. 3B by the operation of the path selection signal memory 106 in synchronization with the clock, the address buffer 306, and the data buffer 302.

Figure 3C:
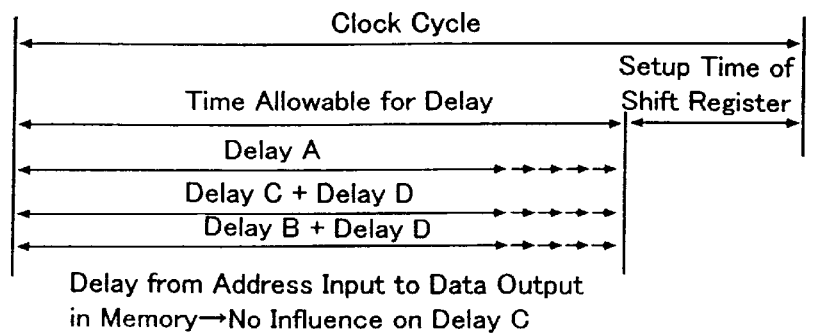
FIG. 3C is a schematic diagram showing operational delays determining the upper limit of a speed of the trace-back operation shown in FIG. 3A.

Therefore, the upper limit of the speed of the trace-back operation is determined as shown in FIG. 3C. In addition to the above-mentioned delays A and C, with consideration to delays B and D relating to the selector 303 and a setup time of the shift register 304, the upper limit of the operation speed is determined depending on the longest delay out of the following delays.

A delay (1) around the path selection signal memory 106: Delay A

A delay (2) around the path selection signal memory 106: Delay C+Delay D

A delay around the selector 303: Delay B+Delay D

In this connection, as described above, the delays A and C can be reduced considerably by the address buffer 306 and the data buffer 302. Therefore, the operation speed is limited by the delay around the selector 303. This delay around the selector 303 is very short as compared to the conventional delay around the path selection signal memory. Therefore, high speed trace-back can be achieved.

Figure 4:
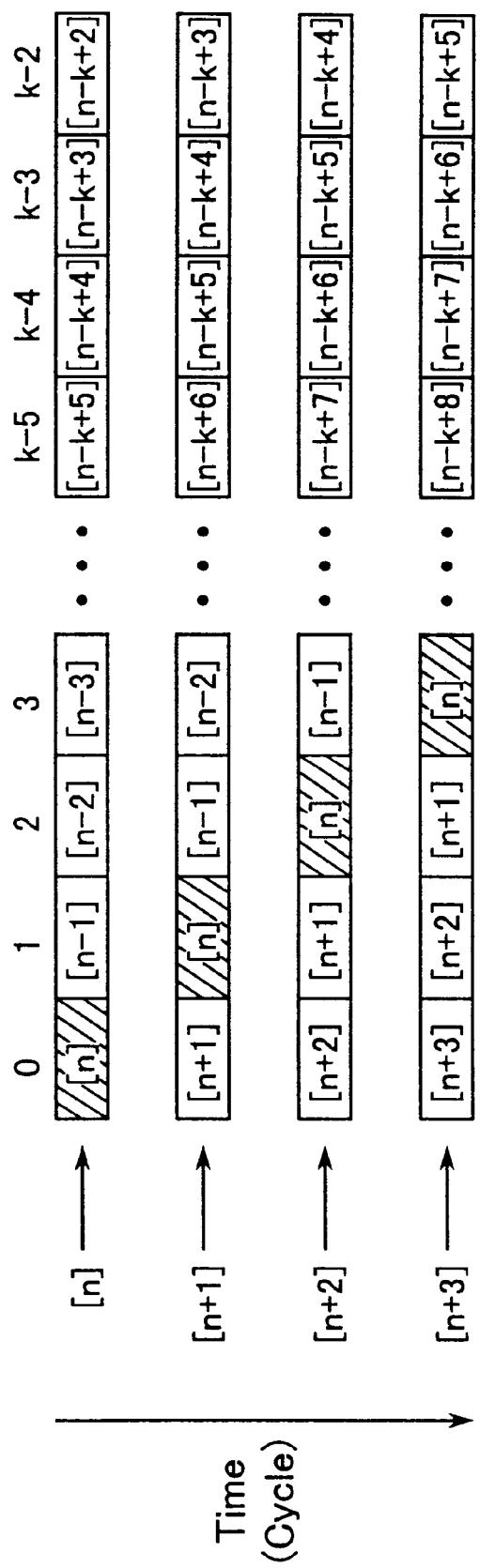
FIG. 4 is a diagram showing the principle of a next Viterbi state prediction section.

Next, the principle of the next Viterbi state prediction section 305, which is an important point in the present embodiment, is described with reference to FIG. 4 as follows.

As described above, the Viterbi state indicates contents of delay elements in the convolutional encoder. The contents of the delay elements are shifted by one bit every time one information bit is input. In other words, one bit shift and time variation in one cycle are equivalent with respect to a part of the Viterbi state. Using this relationship, depending on which bit range in the shift register 304 is selected as a part of the Viterbi state to be a path selection signal memory address, the path selection signal memory address to be updated next can be predicted.

Figure 5A:
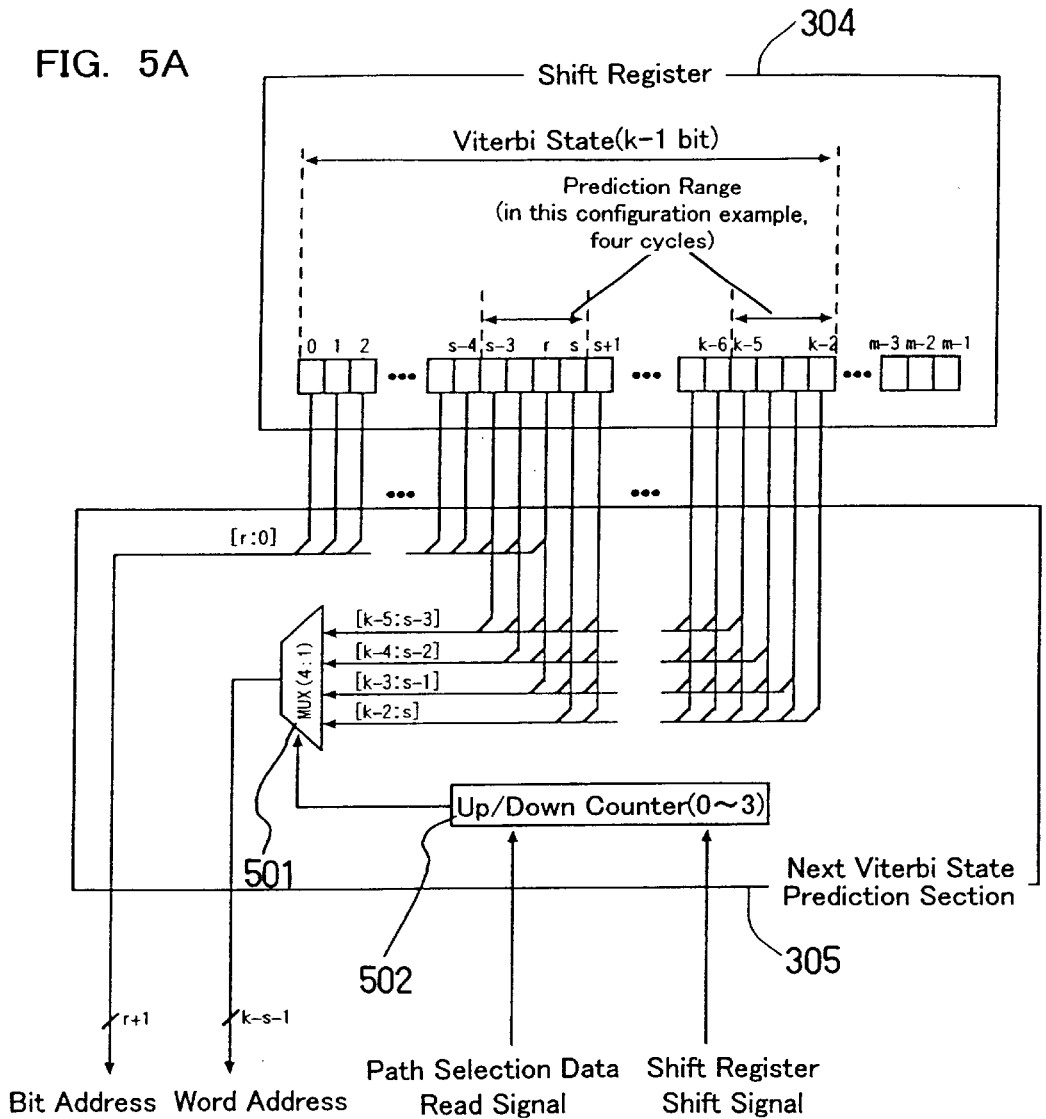
FIG. 5A is a block diagram showing a configuration example of the next Viterbi state prediction section.

A specific circuit structure for achieving this operation is shown in FIG. 5A. A lower order (on an input side of the path selection signal) of a Viterbi state input from the shift register 304 to the next Viterbi state prediction section 305 becomes selection information (a bit address) for the selector 303 (FIG. 3A) extracting a path selection signal from the path selection signal data. Similarly, an upper order of the Viterbi state becomes a path selection signal memory address (a word address), a selector 501 selects a bit range of the Viterbi state from which the word address is to be extracted, and an up/down counter 502 computes the information selected by the selector 501. The value of the up/down counter 502 is changed according to a read signal of path selection data and a shift signal of the shift register 304.

FIG. 5B shows the relationship among a read signal of the path selection data, a shift signal of the shift register, and a value of the up/down counter 502. In FIG. 5B, the up/down counter 502 retains the preceding value when the read signal is "0" (no reading) and the shift signal also is "0" (no shift), or when the read signal is "1" (reading) and the shift signal also is "1" (shift). When the read signal is "1" (reading) and the shift signal is "0" (no shift), the up/down counter 502 adds "1". When the read signal is "0" (no reading) and the shift signal is "1" (shift), the up/down counter 502 subtracts "1".

In the trace-back operation, since the reading of the path selection data and the shift in the shift register always correspond to each other on a one-to-one basis, the state where only one of the read signal and the shift signal is "1" depends on the number of stages in the pipeline structure shown in FIG. 3B. In the case of the present configuration example, the state where the read signal is "1" and the shift signal is "0" continues for three cycles in an initial period of the trace-back, and the state where the read signal is "0" and the shift signal is "1" continues for three cycles in the end of the trace-back. Therefore, when an initial value of the up/down counter 502 is "0", the value of the up/down counter 502 varies between "0" and "3".

FIG. 5C shows the relationship between a value of the up/down counter 502 and a word address to be selected by the selector 501. When the value of the up/down counter 502 increases, i.e. when the read signal is "1" and the shift signal is "0", an operation is carried out so as to select the lower order side of the Viterbi state sequentially as the word address. This operation is executed for predicting a path selection signal memory address to be updated next as described with reference to FIG. 4. This prediction operation uses a part of the bit address as the word address and therefore, the bit width of the maximum bit address can be used as a prediction range.

Figure 6:
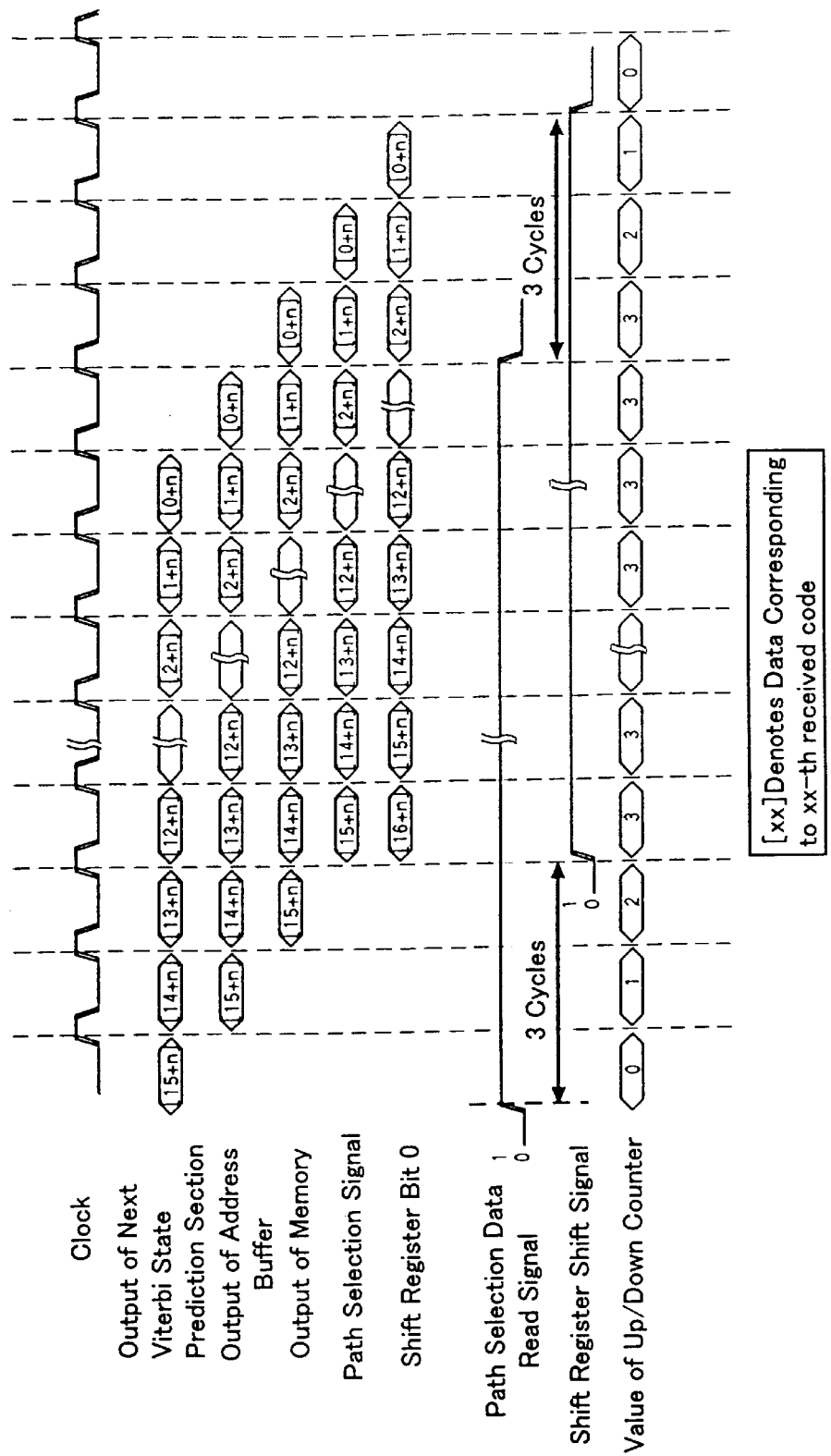
FIG. 6 is a timing chart showing the trace-back operation.

FIG. 6 shows a series of operation timings in the abovementioned trace-back operation. FIG. 6 shows, from the top, a reference clock, an output of the next Viterbi state prediction section 305, an output of the address buffer 306, an output of the memory (the path selection signal memory) 106, a path selection signal, a least significant bit of the shift register 304, a path selection data read signal, a shift register shift signal, and a value of the up/down counter 502. As shown in FIG. 6, the use of the output of the next Viterbi state prediction section 305 allows the trace-back to be executed in the pipeline operation.

According to such an arrangement, high speed trace-back can be achieved while using a conventional RAM.

Figure 7:
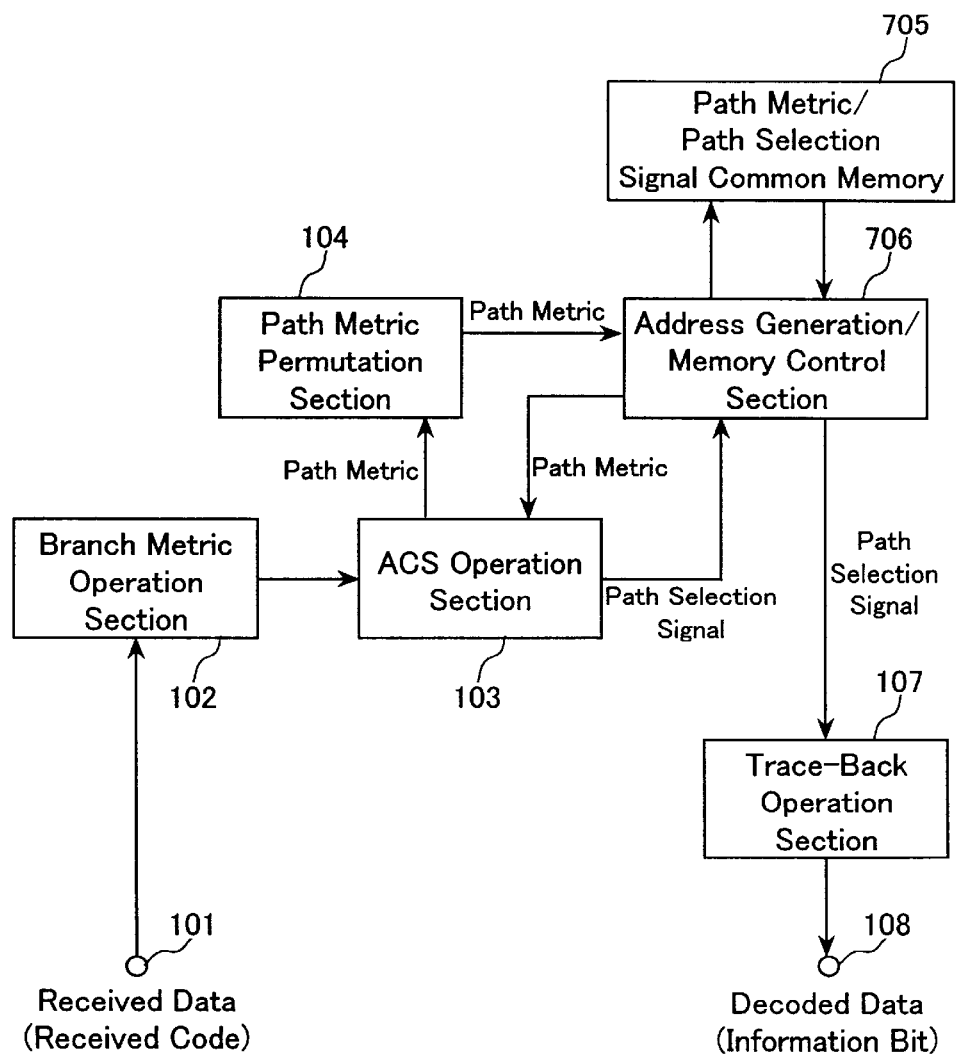
FIG. 7 is a block diagram showing a schematic configuration of a Viterbi decoder with one RAM shared among respective operation sections, according to another embodiment of the present invention.

With reference to FIG. 7, an example of a Viterbi decoder according to another embodiment of the present invention is described as follows. In the Viterbi decoder, the aforementioned operation means and a conventional RAM are used and the use of the RAM is minimized.

A Viterbi decoder shown in FIG. 7 includes an address generation/memory control section 706 and a path metric/path selection signal common memory 705 in addition to the aforementioned branch metric operation section 102, ACS operation section 103, path metric permutation section 104, and trace-back operation section 107. The address generation/memory control section 706 is connected to the ACS operation section 103, the path metric permutation section 104, and the trace-back operation section 107. The path metric/path selection signal common 706.

The address generation/memory control section 706 generates the following memory access address MEMADR from path metric state numbers n and m and a path selection signal state number j based on a path metric memory area start address PMSADR, a path selection signal memory area start address PSSADR, and a memory area assignment signal PMPSSEL.

MEMADR=PMPSSEL?(PMSADR+n):(PMSADR+m):(PSSADR+j)

In the above, the operation expression s?x:y:z indicates an operation for outputting x, y, and z when s=0, 1, and 2, respectively.

Figure 8:
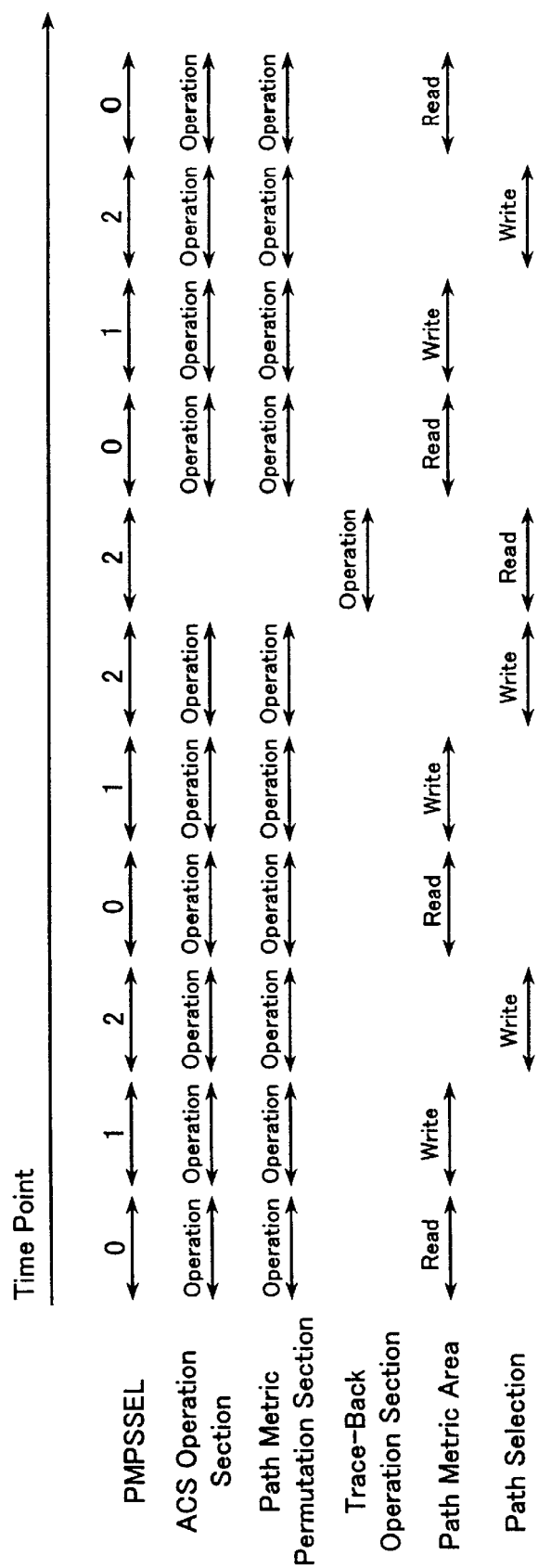
FIG. 8 is a timing chart showing operations of sharing one RAM among the respective operation sections.

During the Viterbi decoding operation, as shown in FIG. 8, the PMPSSEL is changed to any one of 0, 1, and 2 at appropriate time points, and the ACS operation section 103, the path metric permutation section 104, and the trace-back operation section 107 operate in synchronization with the PMPSSEL, respectively.

According to such an arrangement, Viterbi decoding in which one conventional RAM is shared among the respective operation sections and the use of the RAM is minimized can be achieved.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A Viterbi decoder, comprising:

a branch metric operation section for calculating branch metrics based on input codes;

an add-compare-select (ACS) operation section for calculating path metrics of respective states by time-sharing processing based on the branch metrics calculated by the branch metric operation section, selecting a maximum likelihood path in combination with a path metric at a preceding time point, and generating a path selection signal as information of the maximum likelihood path thus selected (a surviving path);

a path metric permutation section for temporarily delaying the path metrics sequentially calculated by and output from the ACS operation section and permutating the path metrics to have different time series from those of the path metrics output from the ACS operation section;

a path metric/path selection signal common memory for storing path metrics and path selection signals;

a trace-back operation section for searching past state transition using a past path selection signal read out from the path metric/path selection signal common memory and outputting decoded data, the trace-back operation section including:

a Viterbi state memory for storing a Viterbi state following the surviving path based on the path selection signal obtained from the path metric/path selection signal common memory;

a Viterbi state prediction section for predicting a part of a Viterbi state to be updated next based on contents of the Viterbi state memory; and a path selection signal memory address calculation section for calculating an address of the path selection signal memory storing the path selection signal based on the part of the Viterbi state predicted by the Viterbi state prediction section; and an address generation/memory control section for receiving path metrics from the path metric permutation section and the path selection signal from the ACS operation section, generating and writing a specific address with respect to the path metric/path selection signal common memory, reading out the path metrics and the path selection signal that are stored in the path metric/path selection signal common memory, and supplying the path metrics to the ACS operation section and the path selection signal to the trace-back operation section, wherein the ACS operation section, the path metric operation section, and the trace-back operation section access the path metric/path selection signal common memory in a time sharing manner under control by the address generation/memory control section.

2. A Viterbi decoder, comprising:

a branch metric operation section for calculating branch metrics based on input codes;

an add-compare-select (ACS) operation section for calculating path metrics of respective states by time-sharing processing based on the branch metrics calculated by the branch metric operation section;

a path metric permutation section for temporarily delaying the path metrics sequentially calculated by and output from the ACS operation section and permutating the path metrics to have different time series from those of the path metrics output from the ACS operation section; and a path metric memory for storing path metrics output from the path metric permutation section, wherein the path metric permutation section temporarily delays time series of plural pairs of path metrics of upper order states nad path metrics of lower order states calculated by the ACS operation section and permutates the path metrics to obtain time series of plural pairs of path metrics of continuous even number states and path metrics of continuous odd number states.

3. The Viterbi decoder according to claim 2, wherein the Viterbi state prediction section includes:

an up/down counter for changing a state according to a readout control signal of the path selection signal memory and a shift control signal of the Viterbi state memory; and a selector for changing a correspondence between the contents of the Viterbi state memory and the part of the Viterbi state to be updated next according to a value of the up/down counter.

4. The Viterbi decoder according to claim 2, wherein pipeline processing is employed in at least one stage selected from:

a stage where the path selection signal memory address calculation section calculates an address based on the part of the Viterbi state predicted by the Viterbi state prediction section;

a stage where based on the address thus calculated the path selection signal from the path selection signal memory is read out; and a stage where based on the path selection signal thus read out the Viterbi state following the surviving path is stored in the Viterbi state memory.

5. A Viterbi decoder, comprising:

a branch metric operation section for calculating branch metrics based on input codes;

an add-compare-select (ACS) operation section for calculating path metrics of respective states by time-sharing processing based on the branch metrics calculated by the branch metric operation section;

a path metric permutation section for temporarily delaying the path metrics sequentially calculated by and output from the ACS operation section and permutating the path metrics to have different time series from those of the path metrics output from the ACS operation section; and a path metric memory for storing path metrics output from the path metric permutation section, wherein using the path metric permutation section for temporarily delaying time series of plural pairs of path metrics of upper order states and path metrics of lower order states calculated by the ACS operation section and permutating the path metrics to obtain time series of plural pairs of path metrics of continuous even number states and path metrics of continuous odd number states, four path metrics are updated by two-time readouts and two-time writings with respect to the path metric memory alone.

6. A Viterbi decoder, comprising:

a branch metric operation section for calculating branch metrics based on input codes;

an add-compare-select (ACS) operation section for calculating path metrics of respective states by time-sharing processing based on the branch metrics calculated by the branch metric operation section;

a path metric permutation section for temporarily delaying the path metrics sequentially calculated by and output from the ACS operation section and permutating the path metrics to have different time series from those of the path metrics output from the ACS operation section;

a path metric memory for storing path metrics output from the path metric permutation section;

a path selection signal memory;

a trace-back operation section, wherein the ACS operation section also selects a maximum likelihood path in combination with a path metric at a preceding time point and generates a path selection signal as information of the maximum likelihood path thus selected (a surviving path), the path selection signal memory stores the path selection signal, the trace-back operation section searches past state transition using a past path selection signal read out from the path selection signal memory and outputs decoded data, and the trace-back operation section includes:

a Viterbi state memory for storing a Viterbi state following the surviving path based on the path selection signal obtained from the path selection signal memory;

a Viterbi state prediction section for predicting a part of a Viterbi state to be updated next based on contents of the Viterbi state memory; and a path selection signal memory address calculation section for calculating an address of the path selection signal memory storing the path selection signal based on the part of the Viterbi state predicted by the Viterbi state prediction section.

* * * * *